(12) United States Patent
Cavelier et al.

(10) Patent No.: US 7,016,645 B2
(45) Date of Patent: Mar. 21, 2006

(54) AMPLIFIER SYSTEM FOR SATELLITES

(75) Inventors: Luc Cavelier, Cannes (FR); Muriel Aveline, Plaisance-du-Touch (FR); Philippe Voisin, Toulouse (FR)

(73) Assignee: Alcatel, Paris (FR)

( * ) Notice: Subject to any disclaimer, the term of this patent is extended or adjusted under 35 U.S.C. 154(b) by 387 days.

(21) Appl. No.: 10/622,711

(22) Filed: Jul. 21, 2003

(65) Prior Publication Data

US 2004/0132404 A1 Jul. 8, 2004

(30) Foreign Application Priority Data

Jul. 22, 2002 (FR) ................................ 02 09262

(51) Int. Cl.
*H04B 7/185* (2006.01)
(52) U.S. Cl. ................. 455/12.1; 455/13.4; 330/124 R
(58) Field of Classification Search ................. 45/3.02, 45/7, 11.1, 12.1, 13.4, 427, 127.1, 127.2, 45/232.1; 330/124 R, 149, 278, 295
See application file for complete search history.

(56) References Cited

U.S. PATENT DOCUMENTS

| 4,701,716 A | 10/1987 | Poole |
| 5,187,447 A | 2/1993 | Tsai |
| 5,329,248 A * | 7/1994 | Izadian ....................... 330/295 |
| 5,576,671 A * | 11/1996 | Agar et al. .................. 330/295 |
| 5,896,065 A * | 4/1999 | Myer ......................... 330/295 |
| 6,538,509 B1 * | 3/2003 | Ren ....................... 330/124 R |
| 2001/0024141 A1 | 9/2001 | Kuriyama |

FOREIGN PATENT DOCUMENTS

| DE | 28 07 813 B1 | 6/1979 |
| EP | 1 191 707 A | 3/2002 |

* cited by examiner

*Primary Examiner*—Quochien B. Vuong
(74) *Attorney, Agent, or Firm*—Sughrue Mion, PLLC

(57) ABSTRACT

The present invention relates to an amplifier system for satellites, in particular for radio-frequency amplifier systems incorporating travelling wave tube amplifiers and used in space repeaters. The amplifier system (1) includes two amplifier modules ($A_1$, $A_2$) each having an input and an output, a signal divider (D) having an input, a first output, and a second output, a signal combiner (C) having a first input, a second input and an output. The first output of the divider (D) is connected to the input of the first amplifier module ($A_1$) via a connection length $Le_1$. The second output of the divider (D) is connected to the input of the second amplifier module ($A_2$) via a connection length $Le_2$. The output of the first amplifier module ($A_1$) is connected to the first input of the combiner (C) via a connection length $Ls_1$. The output of the second amplifier module ($A_2$) is connected to the second input of the combiner (C) via a connection length $Ls_2$. The connection length satisfies the equation $Le_1+Ls_1=Le_2+Ls_2$ and the connection length $Ls_1$ is different from the connection length $Ls_2$.

6 Claims, 3 Drawing Sheets

1

AMPLIFIER SYSTEM FOR SATELLITES

The present invention relates to an amplifier system for satellites, and is more particularly suited to radio frequency amplifier systems used in space relay stations and incorporating traveling wave tube amplifiers.

When signals are transmitted via satellites, the high-frequency carriers from a terrestrial transmitter are received by the satellite at very low power levels because of the distance that the radio waves must travel. Accordingly, before retransmitting them toward the Earth, the satellite must return them to a sufficient power level for a terrestrial receiver to be able to detect them. To this end, the satellite is equipped with high-power amplifiers each of which operates in a defined high-frequency band. The set of components for amplifying the carriers in a given range of frequencies is called a repeater and comprises one or more high-power amplifiers and filters at the input and at the output of the amplifier to isolate the carriers intended for a given repeater from those intended for another repeater. The high-power amplifiers are generally traveling wave tubes. In addition to amplifying the signals received, the repeater retransmits them to the terrestrial stations on another frequency. The following description is limited to the amplifier part of the repeater. Consequently, the information to be amplified by the repeater is referred to interchangeably as a signal or a carrier hereinafter.

An amplifier tube has a maximum power of the order of 100 W to 200 W. Accordingly, to achieve high radio-frequency powers on board a satellite, it is standard practice to use traveling wave tubes in parallel. To this end, signal dividers are used, and the signals are then amplified by the tubes and then recombined by signal couplers.

This can give rise to certain difficulties, however.

Thus the divided signal must travel over two separate paths and recombining the divided and amplified signals at the output is efficient only if they are perfectly in phase, the phase being directly related to the distance traveled by the signal.

The sum of a signal S1 of power P1 and a signal S2 of power P2 with identical waveforms and a relative phase difference $\Delta\phi$ is a signal S of power P such that:

$$P = \frac{P_1 + P_2}{2} + \sqrt{P_1 P_2} \cos\Delta\varphi$$

Consequently, the higher the phase difference, the lower the power P and the less efficient the parallel connection of the tubes.

FIG. 1 shows one solution to these problems. Thus the FIG. 1 configuration shows an amplifier system 1 including:

three amplifier tubes $A_1$, $A_2$ and $A'_{1,2}$, a signal divider D having an input, a first output, and a second output, and a signal coupler C having a first input, a second input, and an output.

The first output of the divider D is connected to the input of the first amplifier tube $A_1$ via a connection length $Le_1$.

The second output of the divider D is connected to the input of the second amplifier tube $A_2$ via a connection length $Le_2$.

The output of the amplifier tube $A_1$ is connected to the first input of the combiner C via a connection length $Ls_1$.

The output of the second amplifier tube $A_2$ is connected to the second input of the combiner C by a connection length $Ls_2$.

The output of the combiner is connected to the output S of the repeater by a connection length L.

The amplifier tube $A'_{1,2}$ is an inactive redundant tube used only in the event of failure of one of the tubes $A_1$ or $A_2$.

The input side connections of an amplifier are generally made by means of coaxial cables and the output side connections of an amplifier are generally made by waveguides, because the output signals are of higher power.

This configuration is totally symmetrical at the input and at the output, i.e. the connection lengths are all equal. This means that no phase difference is introduced between the signals that are divided and then recombined.

Nevertheless, the use of this kind of configuration gives rise to certain difficulties.

The symmetry of the arrangement imposes geometrical constraints on the routing of the output section wiring harness and a high waveguide consumption. Accordingly, the output of the repeater being fixed, the geometrical constraints associated with the symmetry of the amplifier system impose the use of a long waveguide for the connection to the output. This use of long output waveguides causes ohmic losses. These losses increase in proportion to the frequency.

Furthermore, the increased use of waveguides increases the cost and the total mass of the repeater.

The present invention aims to provide an amplifier system for satellites that limits ohmic losses and the cost of the repeater and the increase in its overall mass, whilst keeping the signals in phase.

To this end the present invention proposes an amplifier system for satellites including:

first and second amplifier modules each having an input and an output, a signal divider having an input, a first output, and a second output, a signal combiner having a first input, a second input and an output, said first output of said divider being connected to said input of said first amplifier module via a connection length $Le_1$, said second output of said divider being connected to said input of said second amplifier module via a connection length $Le_2$, said output of said first amplifier module being connected to said first input of said combiner via a connection length $Ls_1$, said output of said second amplifier module being connected to said second input of said combiner via a connection length $Ls_2$, and said connection lengths satisfying the equation $Le_1+Ls_1=Le_2+Ls_2$, which system is characterized in that the connection length $Ls_1$ is different from the connection length $Ls_2$.

Thanks to the invention, the connections, generally provided by waveguides, on the output side of the amplifier stage are no longer of equal length, so that the designer can use the shortest possible connections to the output, which facilitates the arrangement of the connections. The reduced length of the connections reduces ohmic losses and the total mass of the system. The relative phase of the signals between the input and the output of the system is nevertheless maintained thanks to the equation $Le_1+Ls_1=Le_2+Ls_2$, which enables the signals to travel the same connection length from end to end. Moreover, for an equal connection length, the system according to the invention offers improved power performance and therefore the possibility of reducing the amplifier power.

The length $Le_1$ is advantageously equal to the length $Ls_2$ and the length $Le_2$ is advantageously equal to the length $Ls_1$.

In one embodiment at least one of the amplifier modules is a traveling wave tube amplifier or a semiconductor SSPA (Solid State Power Amplifier).

The connections between the outputs of said amplifier modules and the input of said combiner are advantageously waveguides.

In an advantageous embodiment at least one of said amplifier modules includes:
  first and second amplifier submodules each having an input and an output,
  a signal divider having an input, a first output, and a second output, and
  a signal combiner having a first input, a second input, and an output,
  said first output of said divider being connected to said input of said first amplifier submodule via a connection length $Le_{11}$,
  said second output of said divider being connected to said input of said second amplifier submodule via a connection length $Le_{12}$,
  said output of said first amplifier submodule being connected to said first input of said combiner via a connection length $Ls_{11}$,
  said output of said second amplifier submodule being connected to said second input of said combiner via a connection length $Ls_{12}$,
  said connection lengths satisfying the equation $Le_{11}+Ls_{11}=Le_{12}+Ls_{12}$, and the connection length $Ls_{11}$ being different from the connection length $Ls_{12}$.

Accordingly, the amplifier system according to the invention comprises amplifier modules that are either single amplifier tubes or a set of tubes in parallel providing the amplification. Said module can then itself be regarded as equivalent to an amplifier system according to the invention with an appropriate arrangement of its output connections.

Other features and advantages of the present invention will become apparent in the course of the following description of one embodiment, which is given by way of illustrative and nonlimiting example.

In the accompanying drawings.

In all the figures, common items carry the same reference numbers.

Figure 1:
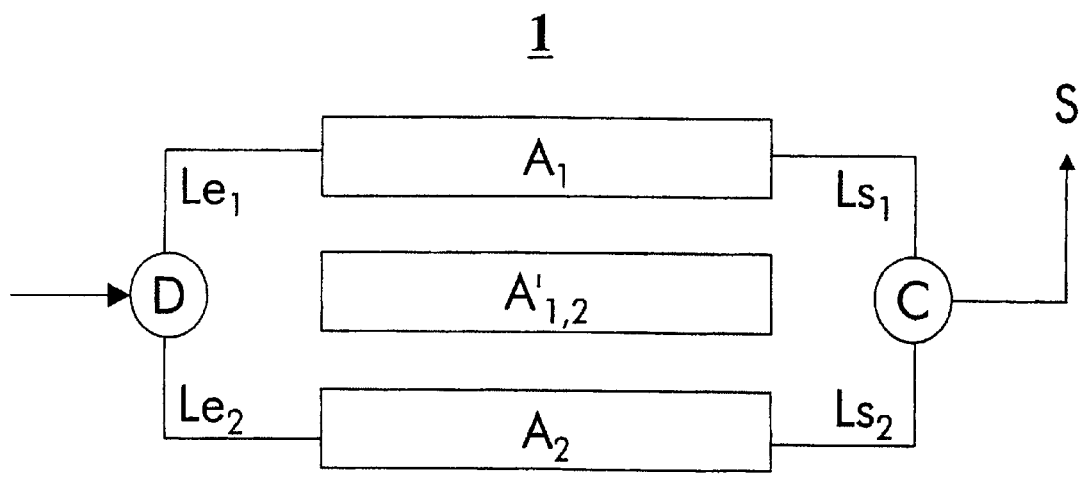
FIG. 1 shows a prior art amplifier system.

FIG. 1 has already been described in relation to the prior art.

Figure 2:
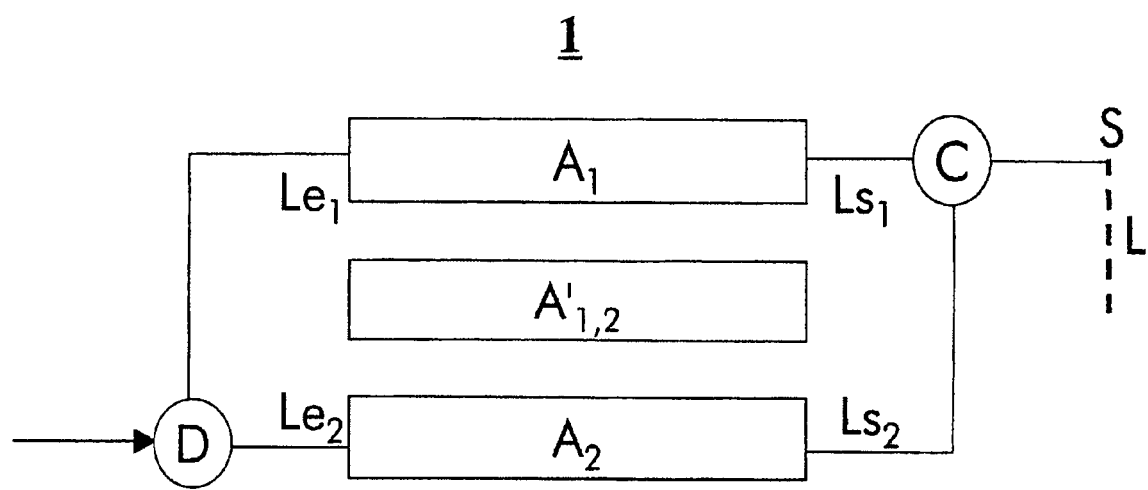
FIG. 2 shows an amplifier system according to the invention including three tubes in parallel.

FIG. 2 shows an amplifier system 1 in accordance with the invention. The system 1 includes:
  three amplifier tubes ($A_1$, $A_2$ and $A'_{1,2}$),
  a signal divider D having an input, a first output, and a second output,
  a signal combiner C having a first input, a second input and an output.

The first output of the divider D is connected to the input of the first amplifier tube $A_1$ via a connection length $Le_1$.

The second output of the divider D is connected to the input of the second amplifier tube $A_2$ via a connection length $Le_2$.

The output of the first amplifier tube $A_1$ is connected to the first input of the combiner C via a connection length $Ls_1$.

The output of the second amplifier tube $A_2$ is connected to the second input of the combiner C via a connection length $Ls_2$.

The amplifier tube $A'_{1,2}$ is an inactive redundant tube used only in the event of failure of one of the tubes $A_1$ or $A_2$.

The connections of lengths $Le_1$ and $Le_2$ are made by coaxial cables and the connections of lengths $Ls_1$ and $Ls_2$ are made by waveguides.

The connection lengths satisfy the equation $Le_1+Ls_1=Le_2+Ls_2$, which enables the signals divided and then recombined to remain in phase since they all travel the same path between the input and the output of the system 1.

The length $Ls_1$ is different from the length $Ls_2$, and the combiner C can therefore be close to the output S.

In this embodiment, the length $Le_1$ is equal to the length $Ls_2$ and the length $Le_2$ is equal to the length $Ls_1$. A length $Le_1$ different from the length $Ls_2$ and a length $Le_2$ different from the length $Ls_1$ can nevertheless be chosen, provided that they satisfy the equation $Le_1+Ls_1=Le_2+Ls_2$.

Compared to the amplifier system shown in FIG. 1, the system according to the invention saves a length L of waveguide substantially equal to the installation pitch of the tubes, which is equal to approximately 0.15 m.

The ohmic losses in the Ka band at a frequency of 20 GHz are from 0.25 to 0.4 dB/m. The system 1 therefore provides an improvement from 0.0375 to 0.06 dB.

Figure 3:
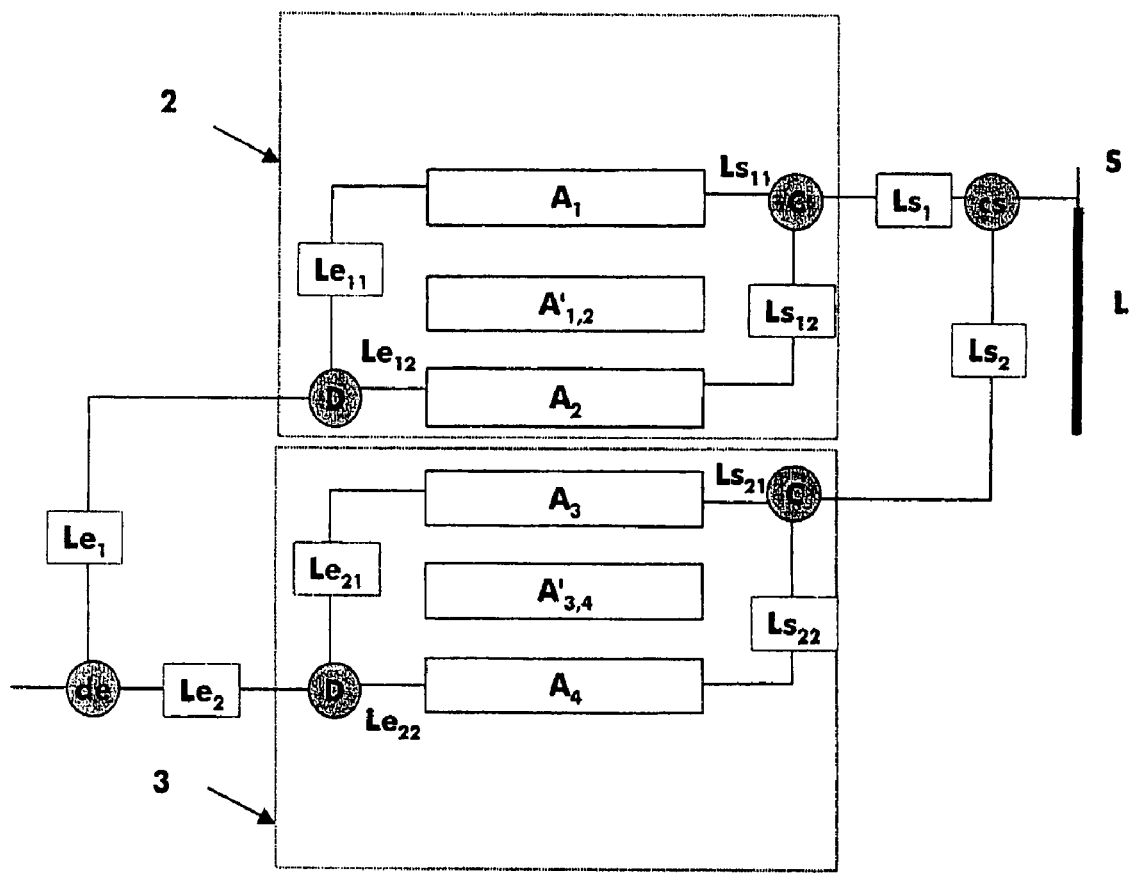
FIG. 3 shows an amplifier system according to the invention including six tubes in parallel.

FIG. 3 shows an amplifier system 4 according to the invention. The system 4 includes:
  two amplifier modules 2 and 3,
  an input signal divider $d_e$ having an input, a first output, and a second output, and
  a signal coupler $c_s$ having a first input, a second input, and an output.

The first output of the divider $d_e$ is connected to the input of the first amplifier module 2 via a connection length $Le_1$.

The second output of the divider $d_e$ is connected to the input of the second amplifier module 3 via a connection length $Le_2$.

The output of the first amplifier module 2 is connected to the first input of the combiner $c_s$ via a connection length $Ls_1$.

The output of the second amplifier module 4 is connected to the second input of the combiner $c_s$ via a connection length $Ls_2$.

The connections of lengths $Le_1$ and $Le_2$ are generally made by coaxial cables and the connections of lengths $Ls_1$ and $Ls_2$ are generally made by waveguides.

The connection lengths satisfy the equation $Le_1+Ls_1=Le_2+Ls_2$.

The length $Ls_1$ is different from the length $Ls_2$.

Each of the amplifier modules 2 and 3 is an amplifier system identical to that described with reference to FIG. 2 for which the lengths $Le_{11}$, $Le_{12}$, $Ls_{11}$ and $Ls_{12}$ correspond to the module 2 and the lengths $Le_{21}$, $Le_{22}$, $Ls_{21}$, and $Ls_{22}$ correspond to the module 3. The module 2 includes three amplifier tubes $A_1$, $A_2$ and $A'_{1,2}$ and the module 3 includes three amplifier tubes $A_3$, $A_4$ and $A'_{3,4}$. One of the modules 2 or 3 could equally be a single amplifier tube.

The combiner $c_s$ is therefore as close as possible to the output S.

Compared to a totally symmetrical amplifier system, the system 4 according to the invention saves a length L of waveguide substantially equal to 2.5×0.15 m, that is to say 0.375 m. The system 4 therefore provides an improvement from 0.094 to 0.15 dB.

Generalizing to n amplifier tubes in parallel, the invention saves a maximum length of $$\frac{n-1}{2} \times 0.15\ m,$$

where n represents the number of tubes installed and 0.15 m the tube installation pitch.

Of course, the invention is not limited to the embodiments that have just been described.

In particular, the two embodiments described relate to three tubes (one of which is redundant) and six tubes (two of which are redundant) in parallel. The invention can be generalized to n tubes in parallel by recurrently defining each amplifier module as an amplifier system according to the invention.

Furthermore, the embodiments have been described with redundant amplifier tubes, which can be dispensed with.

Moreover, the embodiments have been described with amplifier tubes that can be replaced by semiconductor solid-state power amplifiers (SSPA).

Likewise, the connections between the outputs of the amplifier modules and the input of the combiner have been described as waveguides, but can equally be coaxial cables.

The invention claimed is:

1. An amplifier system (1) for satellites including:
first and second amplifier modules ($A_1$, $A_2$) each having an input and an output,
a signal divider (D) having an input, a first output, and a second output,
a signal combiner (C) having a first input, a second input and an output, said first output of said divider (D) being connected to said input of said first amplifier module ($A_1$) via a connection length $Le_1$, said second output of said divider (D) being connected to said input of said second amplifier module ($A_2$) via a connection length $Le_2$, said output of said first amplifier module ($A_1$) being connected to said first input of said combiner (C) via a connection length $Ls_1$, said output of said second amplifier module ($A_2$) being connected to said second input of said combiner (C) via a connection length Ls2, and said connection length satisfying the equation $Le_1+Ls_1 =Le_2 +Ls_2$, which system is characterized in that the connection length $Ls_1$ is different from the connection length $Ls_2$.

2. An amplifier system (1) for satellites according to claim 1 characterized in that said length $Le_1$ is equal to said length $Ls_2$ and said length Le2 is equal to said length $Ls_1$.

3. An amplifier system (1) for satellites according to claim 1 characterized in that at least one of said amplifier modules ($A_1$, $A_2$) is a traveling wave tube amplifier.

4. An amplifier system (1) for satellites according to claim 1 characterized in that at least one of said amplifier modules is a semiconductor SSPA.

5. An amplifier system (1) for satellites according to claim 1 characterized in that the connections between the outputs of said amplifier modules and the input of said combiner are waveguides.

6. An amplifier system (1) for satellites according to claim 1 characterized in that at least one of said amplifier modules (2) includes:
first and second amplifier submodules ($A_1$, $A_2$) each having an input and an output,
a signal divider (d) having an input, a first output, and a second output, and
a signal combiner (c) having a first input, a second input, and an output, said first output of said divider (d) being connected to said input of said first amplifier submodule ($A_1$) via a connection length $Le_{11}$,
said second output of said divider (d) being connected to said input of said second amplifier submodule ($A_2$) via a connection length Le12 ,
said output of said first amplifier submodule ($A_2$) being connected to said first input of said combiner via a connection length $Ls_{11}$,
said output of said second amplifier submodule being connected to said second input of said combiner via a connection length $Ls_{12}$, said connection lengths satisfying the equation $Le_{11}+Ls_{11}=Le_{12}+Ls_{12}$, and the connection length $Ls_{11}$ being different from the connection length $Ls_{12}$.

* * * * *